(12) United States Patent
Griesbach et al.

(10) Patent No.: US 7,245,468 B2
(45) Date of Patent: Jul. 17, 2007

(54) ELECTRO-STATIC DISCHARGE (ESD) POWER CLAMP WITH POWER UP DETECTION

(75) Inventors: William R. Griesbach, Pocono Pines, PA (US); Che Choi C. Leung, Bethlehem Township, Northampton County, PA (US)

(73) Assignee: Agere Systems Inc., Allentown, PA (US)

( * ) Notice: Subject to any disclaimer, the term of this patent is extended or adjusted under 35 U.S.C. 154(b) by 28 days.

(21) Appl. No.: 11/049,900

(22) Filed: Feb. 4, 2005

(65) Prior Publication Data
US 2006/0176626 A1    Aug. 10, 2006

(51) Int. Cl.
*H02H 3/00*    (2006.01)
(52) U.S. Cl. ...................................... 361/56
(58) Field of Classification Search ............... 361/56
See application file for complete search history.

(56) References Cited

U.S. PATENT DOCUMENTS

| | | | |
|---|---|---|---|
| 5,239,440 A | | 8/1993 | Merrill |
| 5,946,177 A | * | 8/1999 | Miller et al. ................ 361/56 |
| 6,008,970 A | * | 12/1999 | Maloney et al. ............. 361/56 |
| 6,369,994 B1 | * | 4/2002 | Voldman ...................... 361/56 |
| 6,388,850 B1 | * | 5/2002 | Ker et al. ..................... 361/56 |
| 6,522,511 B1 | * | 2/2003 | John et al. .................... 361/56 |
| 6,728,086 B2 | * | 4/2004 | Hung et al. ................... 361/56 |
| 6,801,416 B2 | * | 10/2004 | Hatzilambrou et al. ....... 361/56 |
| 6,958,896 B2 | * | 10/2005 | Lin et al. ...................... 361/56 |
| 7,164,565 B2 | * | 1/2007 | Takeda ........................ 361/56 |
| 2004/0107328 A1 | * | 6/2004 | Schultz et al. .............. 711/170 |
| 2004/0109270 A1 | * | 6/2004 | Stockinger et al. ........... 361/56 |
| 2005/0057866 A1 | * | 3/2005 | Mergens et al. .............. 361/56 |

OTHER PUBLICATIONS

Stockinger et al., "Boosted and Distributed Rail Clamp Networks for ESD Protection in Advanced CMOS Technologies", EOS/ESD Symposium, ESD Association, 2003, no month.
Merrill et al., "ESD Design Methodology", EOS/ESD Symposium 93-233, pp. 5B.5.1-5B.5.5, no date.

* cited by examiner

*Primary Examiner*—Ronald W. Leja

(57) ABSTRACT

An ESD power clamp utilizes both a transient triggering method integrated together with a voltage level detection circuit to disable a MOSFET transistor forming the ESD power clamp unless the voltage level on a relevant power supply rail is higher than a predetermined level above the normal power supply voltage. When the voltage level of the power supply rail is higher than the predetermined level (e.g., 10% higher, 25% higher, etc.), then the power surge is presumed to be an ESD pulse, and thus the ESD power clamp is enabled to turn ON and discharge the ESD power surge.

28 Claims, 4 Drawing Sheets

ELECTRO-STATIC DISCHARGE (ESD) POWER CLAMP WITH POWER UP DETECTION

BACKGROUND OF THE INVENTION

1. Field of the Invention

This invention relates to integrated circuits (ICs). More particularly, it relates to a design technique and method to better protect electrical circuits such as an integrated circuit from electrostatic discharge (ESD) damage.

2. Background of Related Art

Electro-static discharge (ESD) is a potentially harmful high voltage spike of electricity that can be catastrophic to one or all integrated circuits (ICs) in an electronic device. Many will appreciate the spark that occurs between ones finger and a metal object after shuffling ones feet across a wool rug.

The possibility of ESD exposure has been accommodated in many conventional integrated circuits (ICs). For instance, signal pins of an ICs are protected by diodes or snapback devices in such a way that the ESD protection device is turned off during normal use of the ICs, but during a static discharge event the ESD protection turns on and provides a current path to ground for the static discharge. Power and ground pins are protected by power clamps which could use a snapback device or a MOSFET between power and ground to protect the IC during electrostatic discharges. A MOSFET based power clamp typically uses a triggering circuit to turn on (trigger) the MOSFET during an electrostatic discharge. By choosing an appropriate triggering circuit, the MOSFET based power clamp could turn on at a much lower voltage than a snapback based power clamp during an ESD event. Thus providing better protection to the ICs against electro-static discharge.

There are three prevalent general approaches to the design of the triggering circuit for the MOSFET based power clamp. A first approach uses a circuit to detect the voltage level of the power rail, and triggers a power clamp when the voltage level is higher than the normal power supply voltage by a certain amount (e.g., when higher than 25%).

A main disadvantage in conventional power clamp technologies is that the circuit must be designed such that the power clamp must not turn ON during normal operation, otherwise it will lock up the IC. Because of this, the triggering voltage is conventionally set to be much higher than the normal power supply voltage, e.g., 30% higher than the normal power supply voltage. This solution is somewhat ineffective to fully protect against an ESD event.

A second approach is to trigger the power clamp by detecting a voltage surge, or transient, controlling a signal to the base of the MOSFET device. A typical transient triggered MOSFET based power clamp is taught by Merril and Issaq, "ESD Design Methodology," *EOS/ESD Symposium Proceedings* (1993).

While this trigger method has the advantage of a low triggering voltage and hence providing better ESD protection to the IC, it is determined by the present inventors not to be able to clearly distinguish an ESD pulse from the normal power up of a circuit. For instance, a conventional MOSFET based power clamp will likely short the power supply to ground during normal power up of the circuit for a short duration determined by a relevant RC value input to the gate, which is typically set to around 2 to 5 microseconds (uS). Moreover, as the size of the integrated circuit (IC) chip grows, so must the number of power clamps on the chip. As this happens, it then becomes even more dangerous to allow the power clamp(s) to short the power supply to ground for even a few microseconds.

For example, in "hot swap" or "hot plug" applications where a circuit board or even just an integrated circuit (IC) are plugged into a powered system, too many power clamps shorting the power supply to ground could bring the entire system down.

A third conventional predominant approach to protecting an IC from the dangers of electro-static discharge (ESD) uses a circuit to detect the rise time (slew rate) of a triggering pulse, which in turn activates an ESD protection circuit.

It is conventionally assumed that ESD voltage pulses rise much faster than the rise in voltage on the power rail of a normal power supply power ON. In this conventional solution, power clamps are designed to turn ON only if the slew rate is higher than a given predetermined rate, so as to distinguish a normal power ON situation from an ESD voltage pulse. This is discussed, e.g., in Stockinger, et al., "Boosted and Distributed Rail Clamp Networks for ESD Protection in Advanced CMOS Technologies," *EOS/ESD Symposium Proceedings* (2003).

The disadvantage in this conventional methodology is that it assumes that the slew rate of the relevant power supply is slow. However, in some applications such as in a hot-plug application where a plug is connected to a socket of a powered device, the slew rate of the power supply can be very fast. This renders the second approach somewhat ineffective to fully protect against many ESD events.

There is a need to accommodate and improve upon the current designs to avoid the danger of electro-static discharge exposure in an integrated circuit (IC) or functionally similar device.

SUMMARY OF THE INVENTION

In accordance with the principles of the present invention, an ESD power clamping circuit comprises an ESD power clamp connected to a power supply rail. A transient trigger circuit controls the ESD power clamp to be ON in the presence of an ESD surge. A voltage level detection circuit enables the control to the ESD power clamp only when a voltage level of the power supply rail is above a predetermined voltage level.

In accordance with another aspect of the present invention, a method of diverting an ESD power surge to ground comprises generating a triggering signal intended to cause an ESD power clamp to turn ON and thus short a power supply rail to ground, upon detection of an ESD power surge. The triggering signal is disabled such that it does not cause the ESD power clamp to turn ON, when a voltage level of the power supply rail is below a predetermined voltage level.

BRIEF DESCRIPTION OF THE DRAWINGS

Features and advantages of the present invention will become apparent to those skilled in the art from the following description with reference to the drawings, in which.

DETAILED DESCRIPTION OF THE ILLUSTRATIVE EMBODIMENTS

An ESD power clamp in accordance with the principles of the present invention utilizes both a transient triggering method integrated together with a voltage level detection circuit to disable the ESD power clamp unless the voltage level is higher than the relevant normal power supply voltage.

Figure 1:
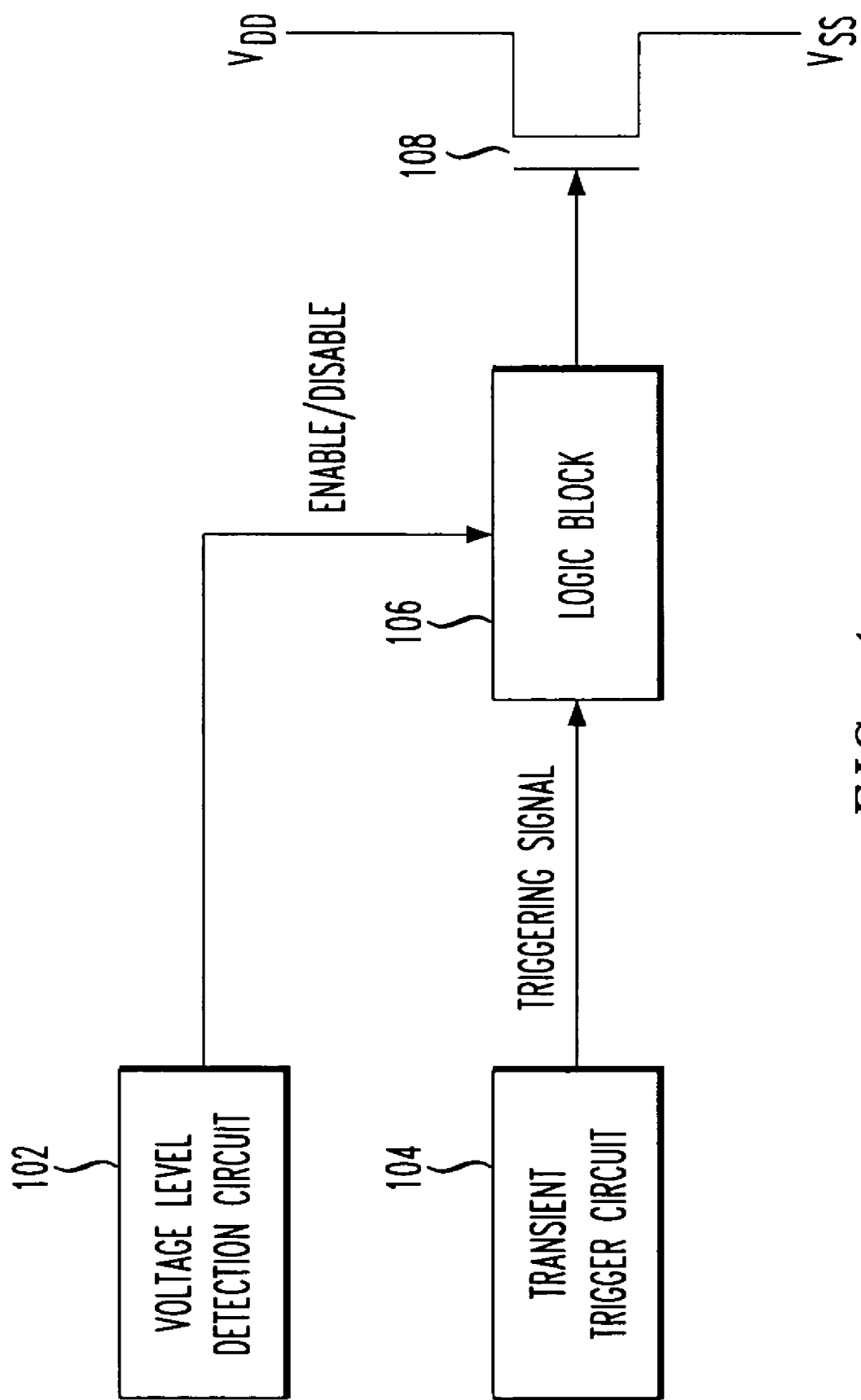
FIG. 1 shows a block diagram of a power clamp controlled by a transient trigger circuit and a voltage level detection circuit, in accordance with the principles of the present invention.

FIG. 1 shows a block diagram of a power clamp controlled by a transient trigger circuit and a voltage level detection circuit, in accordance with the principles of the present invention.

In particular, as shown in FIG. 1, an ESD power clamp 108 is driven by an appropriate logic block 106. The logic block 106 is triggered by a transient trigger circuit 104, and is enabled by a voltage level detection circuit 102.

In the disclosed embodiment, the ESD power clamp 108 comprises a suitably large metal oxide semiconductor field effect transistor (MOSFET) with its conduction path coupled between a power rail (Vdd) and a ground rail (Vss) to provide a sufficient discharge path for an ESD surge. Switching the ESD power clamp 108 to the ON state is triggered by a transient on the power supply rail, and turns itself OFF through a suitable RC timing circuit.

The transient trigger circuit 104 includes an appropriate RC-based timer to detect a transient with a slew rate indicative of an ESD pulse. Though disclosed with an RC-based timer, the transient trigger circuit 104 may include any other suitable timer circuit within the principles of the present invention.

Importantly, the logic block 106 that drives the ESD power clamp 108 (and thus the ESD power clamp 108 itself) is enabled or disabled by the output of the voltage level detection circuit 102. The voltage level detection circuit 102 determines the voltage threshold on the power rail of the relevant integrated circuit (IC) device at which logic block 106 is enabled on a rising voltage or is disabled on a falling voltage.

When the voltage on the power rail is above a normal range of the power supply (e.g., at or above 110% of nominal, or 10% higher than normal), the voltage level detection circuit 102 will enable the logic block 106 that drives and thus allows the power clamp 108 to be turned ON by the transient trigger circuit should a transient be detected on the power rail. However, when the voltage level on the power rail is within or below the normal range of the power supply (e.g., below 110% of nominal, or less than 10% higher than normal), the voltage level detection circuit 102 will disable the logic block 106 overriding the triggering signal from the transient trigger circuit. Even if there is a transient on the power supply (e.g. during normal power up), the ESD power clamp 108 will remain in the OFF state.

Figure 2:
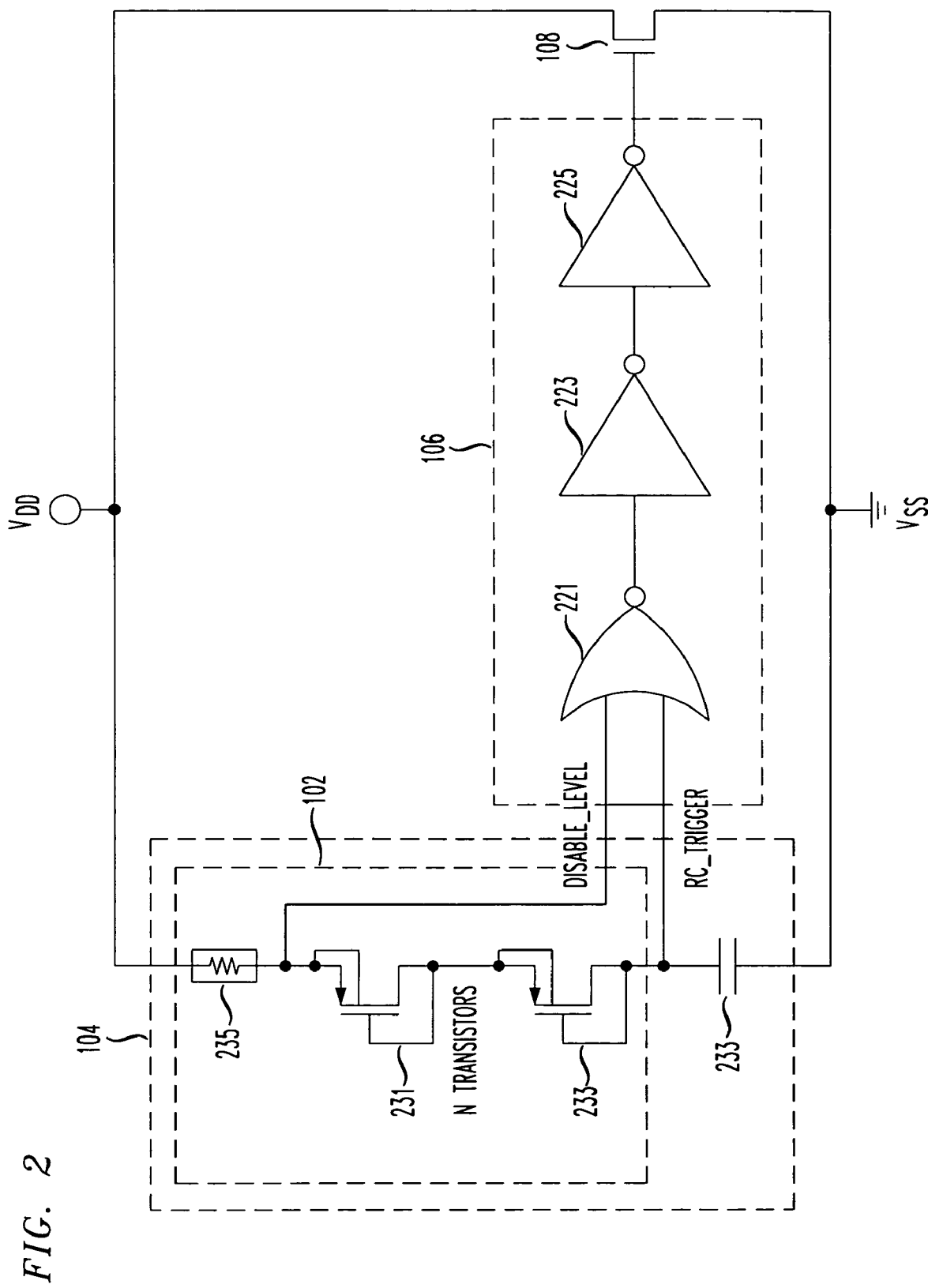
FIG. 2 shows an exemplary implementation schematic of a power clamp with power up detection, in accordance with the principles of the present invention.

FIG. 2 shows an exemplary implementation schematic of an ESD power clamp with power up detection, in accordance with the principles of the present invention.

In particular, as shown in FIG. 2, the logic block 106 may comprise a series combination of a NOR gate 221 and two inverters 223, 225. As can be appreciated, the use of two inverters 223, 225 provides a buffered delay between the NOR gate 221 and the ESD power clamp 108. Implementations including additional inverters for additional delays, or even fewer inverters to quicken the response of the ESD power clamp 108, are possible within the principles of the present invention.

Inputs to the NOR gate 221 are the triggering signal RC_trigger output from the transient trigger circuit 104, and an enable/disable signal disable_level output from the voltage level detection circuit 102. The output of the last inverter 225 in the series combination drives the ESD power clamp 108.

The transient trigger circuit 104 comprises an RC based timer (or other suitable timer). As shown in FIG. 2, the capacitor 237 together with the resistance provided by resistor 235 and the transistors 231, 233, form an RC timer.

In the disclosed embodiment of FIG. 2, the voltage level detection circuit 102 comprises two n-channel MOSFET transistors 231, 233 implemented between the enable/disable signal node 234, and the triggering signal node 236, to generate a reference voltage. It is to be noted that other circuit components might be provided, so long as the voltage level at the enable/disable signal node 234 is relatively independent of the voltage at the power rail node Vdd.

The number of n-channel transistors 231, 233 may be different than the two shown in FIG. 2. For instance, the number of n-channel transistors implemented in the voltage level detection circuit 102 may be chosen so that the voltage at the enable/disable signal node 234 is greater than the voltage needed to force the output of the NOR gate 221 to a LOW state, and hence disable the ESD power clamp 108 when the voltage at the power rail node Vdd is at or below the normal range of the power supply voltage.

In the case of an ESD event, when the voltage at the power rail node Vdd increases above that of the power supply voltage, the voltage at the enable/disable signal node 234 will remain roughly the same. However, the transfer characteristic and the switching voltage of the NOR gate 221 will change drastically. The voltage at the enable/disable signal node 234 will no longer be large enough to force the output of the NOR gate 221 to a LOW state. Rather, the output of the NOR gate 221 will be determined by the voltage level at the triggering signal node 236. Hence, the ESD power clamp 108 will be enabled, and thus can be triggered by a detected ESD transient voltage at the power rail node Vdd.

Figure 3:
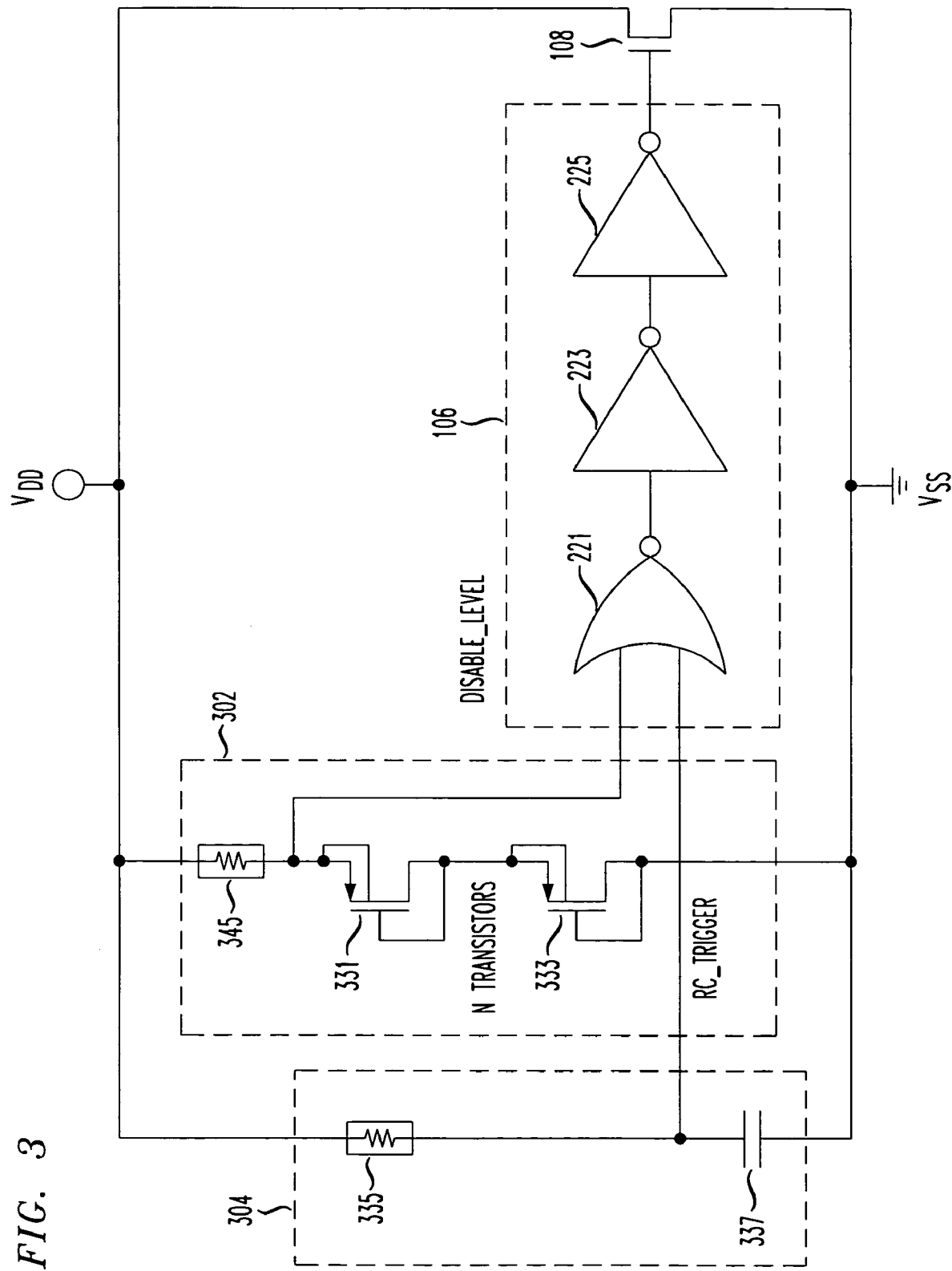
FIG. 3 shows an alternative exemplary implementation schematic of a power clamp with power up detection, in accordance with the principles of the present invention.

FIG. 3 shows an alternative exemplary implementation schematic of a power clamp with power up detection, in accordance with the principles of the present invention. Depending upon particular characteristics of the particular MOSFET transistor used in the ESD power clamp 108, the embodiment shown in FIG. 3 can in certain applications provide better performance than the embodiment shown in FIG. 2.

In particular, as shown in FIG. 3, the ESD power clamp 108 comprises a MOSFET transistor as in the embodiment of FIG. 2, and the logic block 106 still comprises a series combination of a NOR gate 221, and two inverters 223, 225.

The transient trigger circuit 304 utilizes an RC timer based on a capacitor 337 in series with a resistor 335 between the power rail Vdd and the ground rail Vss. The triggering signal RC_trigger is formed at a node between the capacitor 337 and the resistor 335 of the transient trigger circuit 304, such as node 336.

Like the transient trigger circuit 304, a voltage level detection circuit 302 is placed independently between the power rail Vdd and the ground rail Vss. The voltage level detection circuit 302 comprises a series path between the power rail Vdd and the ground rail Vss of a resistor 345, and the conduction paths of two MOSFET transistors 331, 333. The enable/disable signal disable_level is formed at a node 334 between the resistor 345 and transistor 331. Transistors 331 and 333 may be diode connected, as shown, which assures the voltage developed at node 334 is at least two diode drops above Vss.

The transient trigger circuit 304 uses an RC timer and a transient detection to trigger ON the ESD power clamp 108. However, there is no likelihood of locking-up the IC in the embodiment of FIG. 3 as there is in the FIG. 2 embodiment. As a result, the triggering voltage level for disabling the ESD power clamp 108 may be set very close to the normal (i.e., nominal) Vdd level, e.g., to within the tolerance of the power supply itself, e.g., 10%.

Accordingly, the circuit shown in FIG. 3 overcomes disadvantages exhibited by conventional ESD power clamps, e.g., by not requiring a ramp rate of a power supply to be different and slower than that of a typical ESD pulse.

Figure 4:
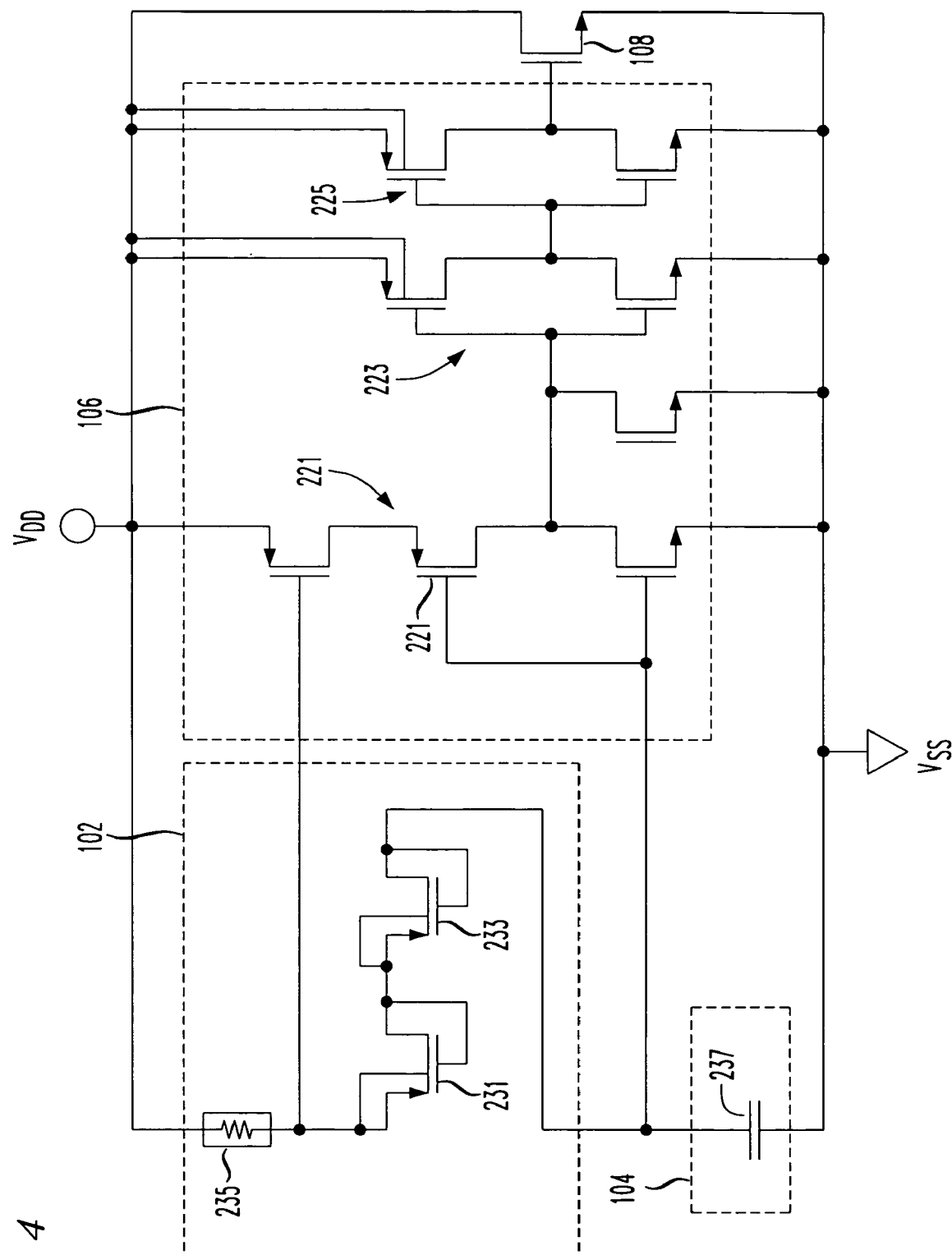
FIG. 4 shows a transistor level implementation of an exemplary power clamp with normal power up detection for a 1.2 volt application, in accordance with the principles of the present invention.

FIGS. 4 show an exemplary transistor level implementation of the inventive ESD power clamp shown in FIG. 2, for a given application using a 1.2 volt power rail Vdd voltage.

In particular, FIG. 4 shows a transistor level implementation of an exemplary power clamp with power up detection for a 1.2 volt application, in accordance with the principles of the present invention.

The voltage level detection circuit 102 is shown within the transient trigger circuit 104, but may be a separate circuit within the principles of the present invention.

The voltage level detection circuit 102 includes a series combination of a resistor 235, and two MOSFET transistors 231, 233. The transient trigger circuit 104 comprises a suitable capacitor 237. An RC time constant is formed by the series combination of the resistance (and capacitance) of the voltage level detection circuit 102 combined with the capacitance of the capacitor 237 in the transient trigger circuit 104.

Accordingly, an ESD power clamp is controlled by a transient trigger circuit that is enabled by a voltage level detection circuit such that the power supply is not shorted to ground during a normal power-UP process. Thus, a reliable ESD power clamp is provided for ESD protection which may be implemented in a wide variety of applications, including hot-plug applications.

While the invention has been described with reference to the exemplary embodiments and process technologies, those skilled in the art will be able to make various modifications to the described embodiments and process technologies of the invention without departing from the true spirit and scope of the invention.

What is claimed is:

1. An electro-static discharge (ESD) power clamping circuit, comprising:
    an ESD power clamp connected to a power supply rail;
    a transient trigger circuit to control said ESD power clamp to be ON in the presence of an ESD surge; and
    a voltage level detection circuit to enable said control to said ESD power clamp only when a voltage level of said power supply rail is above a predetermined voltage level, said voltage level detection circuit comprising a resistance element between said power supply rail and a capacitance device.

2. The electro-static discharge (ESD) power clamping circuit according to claim 1, wherein:
    said power clamping circuit is fabricated as part of an integrated circuit.

3. The electro-static discharge (ESD) power clamping circuit according to claim 1, wherein:
    said predetermined voltage level is at or above 110% of a nominal voltage level of said power supply rail.

4. The electro-static discharge (ESD) power clamping circuit according to claim 1, wherein:
    said predetermined voltage level is at or above 125% of a nominal voltage level of said power supply rail.

5. The electro-static discharge (ESD) power clamping circuit according to claim 1, wherein:
    said voltage level detection circuit prevents said power supply rail from being shorted to a ground rail during a normal power up process.

6. The electro-static discharge (ESD) power clamping circuit according to claim 1, wherein:
    said voltage level detection circuit prevents said power supply rail from being shorted to a ground rail during a normal power ON process.

7. The electro-static discharge (ESD) power clamping circuit according to claim 1, wherein:
    said transient trigger circuit comprises a resistor-capacitor (RC) timer.

8. The electro-static discharge (ESD) power clamping circuit according to claim 1, wherein:
    said voltage level detection circuit is connected in series with said transient trigger circuit between said power supply rail and a ground rail.

9. The electro-static discharge (ESD) power clamping circuit according to claim 1, wherein:
    said voltage level detection circuit is connected in parallel with said transient trigger circuit between said power supply rail and a ground rail.

10. The electro-static discharge (ESD) power clamping circuit according to claim 1, wherein said voltage level detection circuit comprises:
    a series combination of a resistor and a plurality of metal oxide semiconductor field effect transistor (MOSFET) transistors.

11. An electro-static discharge (ESD) power clamping circuit, comprising:
    an ESD power clamp connected to a power supply rail;
    a transient trigger circuit to control said ESD power clamp to be ON in the presence of an ESD surge; and
    a voltage level detection circuit to disable said control to said ESD power clamp only when a voltage level of said power supply rail is below a predetermined voltage level, said voltage level detection circuit comprising a resistance element between said power supply rail and a capacitance device.

12. The electro-static discharge (ESD) power clamping circuit according to claim 11, wherein:
    said power clamping circuit is fabricated as part of an integrated circuit.

13. The electro-static discharge (ESD) power clamping circuit according to claim 11, wherein:
    said predetermined voltage level is at or below 90% of a nominal voltage level of said power supply rail.

14. A method of diverting an electro-static discharge (ESD) power surge to a power or ground rail, comprising:
    generating a triggering signal intended to cause an ESD power clamp to turn ON and thus short a power supply rail, upon detection of an ESD power surge; and
    disabling said triggering signal with a resistance element between said power supply rail and a capacitance device such that it does not cause said ESD power clamp to turn ON, when a voltage level of said power supply rail is below a predetermined voltage level.

15. The method of diverting an electro-static discharge (ESD) power surge to a power or ground rail according to claim 14, wherein:

said ESD power surge is detected on said power supply rail.

16. The method of diverting an electro-static discharge (ESD) power surge to a power or ground rail according to claim 14, wherein:

said predetermined voltage level is at or above 110% of a nominal voltage level of said power supply rail.

17. The method of diverting an electro-static discharge (ESD) power surge to a power or ground rail according to claim 14, wherein:

said predetermined voltage level is at or above 125% of a nominal voltage level of said power supply rail.

18. The method of diverting an electro-static discharge (ESD) power surge to a power or ground rail according to claim 14, wherein:

said power supply rail is prevented from being shorted to said ground during a normal power ON process.

19. The method of diverting an electro-static discharge (ESD) power surge to a power or ground rail according to claim 14, wherein:

said power supply rail is prevented from being shorted to said ground during a normal power ON process.

20. A method of diverting an electro-static discharge (ESD) power surge to a power or ground rail, comprising:

generating a triggering signal intended to cause an ESD power clamp to turn ON and thus short a power supply rail, upon detection of an ESD power surge; and enabling said triggering signal with a resistance element between said power supply rail and a capacitance device such that it causes said ESD power clamp to turn ON, when a voltage level of said power supply rail is above a predetermined voltage level.

21. The method of diverting an electro-static discharge (ESD) power surge to a power or ground rail according to claim 20, wherein:

said predetermined voltage level is at or below 90% of a nominal voltage level of said power supply rail.

22. The method of diverting an electro-static discharge (ESD) power surge to a power or ground rail according to claim 20, wherein:

said predetermined voltage level is at or below 75% of a nominal voltage level of said power supply rail.

23. Apparatus for diverting an electro-static discharge (ESD) power surge to a power or ground rail, comprising:

means for generating a triggering signal intended to cause an ESD power clamp to turn ON and thus short a power supply rail, upon detection of an ESD power surge; and means for disabling said triggering signal such that it does not cause said ESD power clamp to turn ON, when a voltage level of said power supply rail is below a predetermined voltage level, said means for disabling comprising a resistance element between said power supply rail and a capacitance device.

24. The apparatus for diverting an electro-static discharge (ESD) power surge to a power or ground rail according to claim 23, wherein:

said ESD power surge is detected on said power supply rail.

25. The apparatus for diverting an electro-static discharge (ESD) power surge to a power or ground rail according to claim 23, wherein:

said predetermined voltage level is at or below 110% of a nominal voltage level of said power supply rail.

26. The apparatus for diverting an electro-static discharge (ESD) power surge to a power or ground rail according to claim 23, wherein:

said predetermined voltage level is at or below 125% of a nominal voltage level of said power supply rail.

27. The apparatus for diverting an electro-static discharge (ESD) power surge to a power or ground rail according to claim 23, wherein:

said means for disabling prevents said power supply rail from being shorted to said ground during a normal power ON process.

28. The electro-static discharge (ESD) power clamping circuit according to claim 1, wherein said capacitance device comprises:

at least one n-channel transistor.

* * * * *